United States Patent [19]
Nagakura

[11] Patent Number: 5,477,194
[45] Date of Patent: Dec. 19, 1995

[54] TEMPERATURE COMPENSATED PLL FREQUENCY SYNTHESIZER AND HIGH-SPEED FREQUENCY LOCK METHOD USING THE SAME

[75] Inventor: Tomio Nagakura, Tokyo, Japan

[73] Assignee: NEC Corporation, Tokyo, Japan

[21] Appl. No.: 267,389

[22] Filed: Jun. 29, 1994

[30] Foreign Application Priority Data

Jul. 12, 1993 [JP] Japan ..................... 5-171427

[51] Int. Cl.$^6$ ..................... H03L 7/00
[52] U.S. Cl. ................. 331/10; 331/16; 331/176
[58] Field of Search .............. 331/1 R, 14, 16, 331/17, 34, 176, 10

[56] References Cited

U.S. PATENT DOCUMENTS

| | | | |
|---|---|---|---|
| 4,980,652 | 12/1990 | Tarusawa et al. | 331/1 A |
| 5,036,295 | 7/1991 | Kamitani | 331/10 |
| 5,334,952 | 8/1994 | Maddy et al. | 331/1 A |

FOREIGN PATENT DOCUMENTS 1-305724  12/1989  Japan .

*Primary Examiner*—Robert J. Pascal
*Assistant Examiner*—David H. Vu
*Attorney, Agent, or Firm*—Young & Thompson

[57] ABSTRACT

The present invention relates to a PLL frequency synthesizer including an A-D converter for receiving a frequency control voltage for a voltage-controlled oscillator for outputting a desired frequency in a frequency stable state, and converting the frequency control voltage into a corresponding digital signal and outputting the digital signal, a storage unit for storing a signal value of the digital signal, a D-A converter for converting the signal value into a corresponding analog signal and outputting the analog signal, a control unit for controlling input of the frequency control voltage to the A-D converter, reading of the signal value from the storage unit, and output of the analog signal from the D-A converter, and a loop filter for applying an output voltage of the analog signal to the voltage-controlled oscillator by the control unit before the synthesizer is started, and a high-speed frequency lock method using this synthesizer.

3 Claims, 5 Drawing Sheets

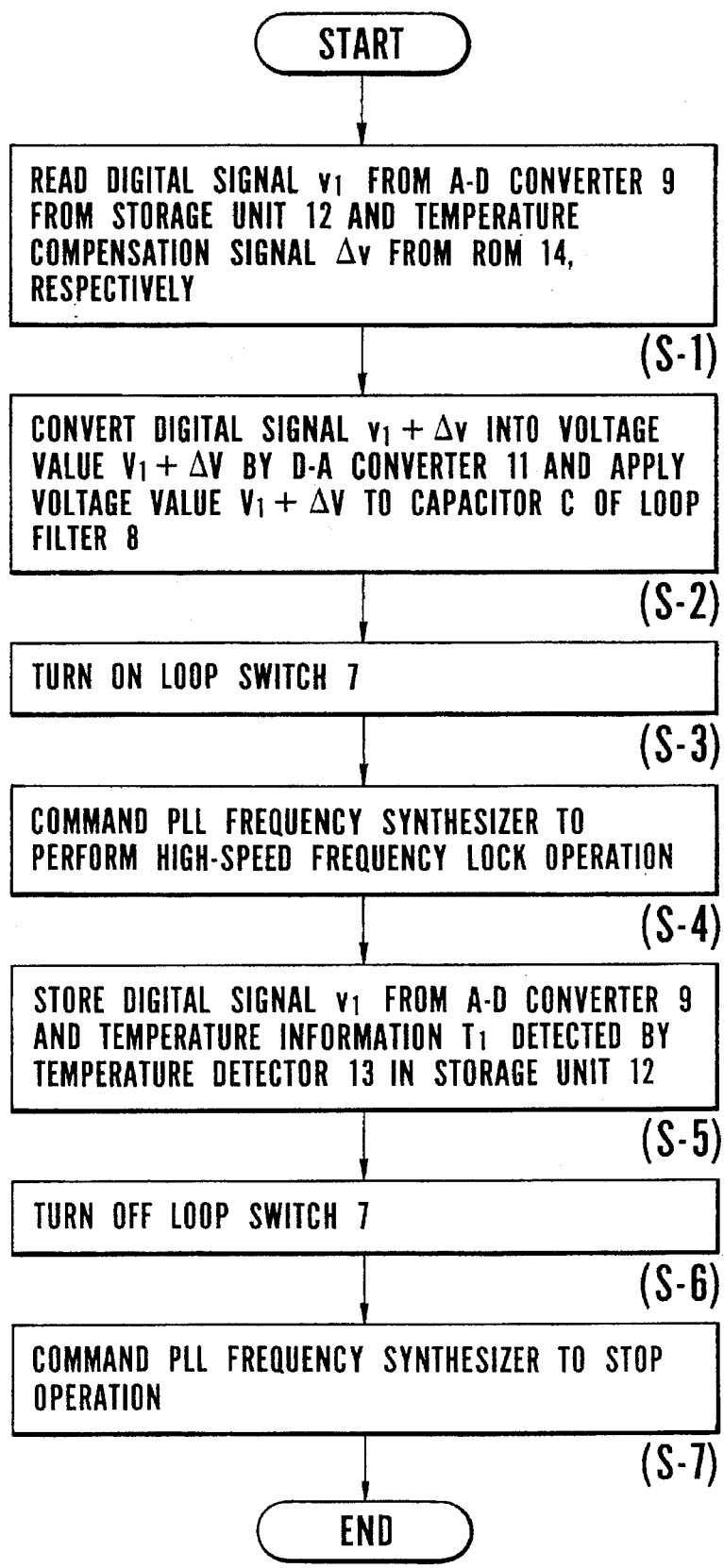

5,477,194

TEMPERATURE COMPENSATED PLL FREQUENCY SYNTHESIZER AND HIGH-SPEED FREQUENCY LOCK METHOD USING THE SAME

BACKGROUND OF THE INVENTION

1. Field of the Invention

The present invention relates to a PLL (Phase-Locked Loop) frequency synthesizer used in a high-frequency multichannel radio or the like and having a high-speed frequency lock function, and a high-speed frequency lock method using this synthesizer.

2. Description of the Related Art

A conventional PLL frequency synthesizer is disclosed in, e.g., Japanese Patent Application Laid-Open No. Hei 1-305724. According to the conventional PLL frequency synthesizer, to realize a high-speed frequency lock operation, a digital signal called from a storage means upon starting the operation is converted into an analog signal, and a potential corresponding to a desired oscillation frequency control voltage of a voltage-controlled oscillator is injected into a loop filter by a potential injecting means.

FIG. 1 is a block diagram showing the PLL frequency synthesizer disclosed in the above application. According to this synthesizer, an output from a reference oscillator 101 is frequency-divided into a 1/M signal output by a frequency divider 102 and input to a phase comparator 103 as a reference signal. On the other hand, an output from a voltage-controlled oscillator 104 for outputting a desired frequency is frequency-divided into a 1/N signal output by a variable frequency divider 105 and input to the phase comparator 103. The phase comparator outputs a phase difference component between the outputs from the frequency divider 102 and the variable frequency divider 105. The output from the phase comparator 103 is input to the control terminal of the voltage-controlled oscillator 104 through a charge pump 106 and a loop filter 107 to control the phase difference with respect to the output from the voltage-controlled oscillator 104. With this operation, a stable output synchronized with the reference signal can be obtained from the voltage-controlled oscillator 104.

To decrease the frequency lock time upon the initial turning on of power or changing of the frequency between channels, the PLL frequency synthesizer also comprises a ROM 110 for outputting a corresponding digital signal on the basis of channel designation data sent from a controller 109, a D-A converter 111 for converting the corresponding signal sent from the ROM 110 into an analog signal, an injection resistor 112 provided to the output circuit of the D-A converter 111, and a changeover switch 113 for switching the operation in accordance with a switching control signal from the controller 109.

In the above-described conventional PLL frequency synthesizer, variations in change in temperature or voltage-controlled oscillator accordingly cause variations the frequency control voltage for a desired frequency. For this reason, a potential in only an approximate range can be applied by the injecting means. This is because the output frequency from the voltage-controlled oscillator largely deviates from the desired frequency upon starting the operation of the PLL frequency synthesizer. In this case, the frequency lock time cannot be sufficiently decreased.

SUMMARY OF THE INVENTION

The present invention has been made to solve the above problem, and has as its first object to provide a PLL frequency synthesizer capable of stably performing a high-speed frequency lock operation regardless of variations in change in temperature or irregularities in devices.

It is the second object of the present invention to provide a stable high-speed frequency lock method using the PLL frequency synthesizer provided by the first object.

According to the first aspect of the present invention, there is provided a PLL frequency synthesizer including a loop filter, comprising an A-D converter for receiving a frequency control voltage from a voltage-controlled oscillator in a frequency stable state to output a digital signal corresponding to the frequency control voltage, a storage unit for storing the digital signal, a D-A converter for receiving a digital signal read from the storage unit to output an analog signal corresponding to the digital signal, and means for applying an output voltage of the analog signal to the loop filter before the frequency synthesizer is started.

According to the second aspect of the present invention, there is provided a PLL frequency synthesizer including a loop filter, comprising an A-D converter for receiving a frequency control voltage from a voltage-controlled oscillator in a frequency stable state to output a first digital signal corresponding to the frequency control voltage, a storage unit for storing the output from the A-D converter as a control voltage, temperature compensating means for outputting a potential difference between frequency control terminals in correspondence with a temperature difference, a control unit for adding the potential difference to the control voltage in the frequency stable state to output a second digital signal, a D-A converter for converting the second digital signal into an analog signal and outputting the analog signal, and means for applying an output voltage of the analog signal to the loop filter before the frequency synthesizer is started.

According to the third aspect of the present invention, there is provided a PLL frequency synthesizer which includes a voltage-controlled oscillator for oscillating and outputting an analog frequency control voltage such that a phase difference component with respect to a reference oscillation voltage is compensated to obtain a stable output frequency synchronized with an analog reference oscillation voltage oscillated and output from a reference oscillator, comprising, an A-D converter for receiving the frequency control voltage in a frequency stable state and converting the frequency control voltage into a corresponding digital signal and outputting the digital signal, a storage unit for storing a signal value of the digital signal, a D-A converter for converting the signal value into a corresponding analog signal and outputting the analog signal, a control unit for controlling input of the frequency control voltage to the A-D converter, reading of the signal value from the storage unit, and output of the analog signal from the D-A converter, and a loop filter for applying an output voltage of the analog signal to the voltage-controlled oscillator by the control unit before the frequency synthesizer is started.

According to the fourth aspect of the present invention, there is provided a PLL frequency synthesizer according to the third aspect, further comprising temperature detecting means for detecting a state temperature around the synthesizer, and temperature compensating means for outputting a temperature compensation signal for compensating a potential difference between terminals of the control unit in correspondence with a temperature difference between operative and inoperative states of the synthesizer and wherein the control unit converts the analog signal into a temperature-compensated temperature compensation analog signal on the basis of the signal value and the compensation signal.

In order to achieve the second object, according to the fifth aspect of the present invention, there is provided a high-speed frequency lock method comprising the steps of reading an output signal from an A-D converter, which is stored in a storage unit, immediately before a PLL frequency synthesizer is started, converting the read signal into an analog signal as an output voltage corresponding to the read signal by a D-A converter, and applying the output voltage to a capacitor of a loop filter, turning on a loop switch to cut off the loop filter from a charge pump, and commanding the PLL frequency synthesizer to perform a high-speed frequency lock operation, detecting an output signal from the A-D converter in a frequency stable state, and storing the output signal in the storage unit, immediately before an operation of the PLL frequency synthesizer is stopped, and turning off the loop switch, and stopping the operation of the PLL frequency synthesizer.

According to the sixth aspect of the present invention, there is provided a high-speed frequency lock method comprising the steps of reading an output signal from an A-D converter, which is stored in a storage and first temperature information immediately before a previous stop, and receiving second temperature information detected by a temperature detector to read a digital value of a voltage change amount corresponding to a temperature difference with respect to the first temperature information from a ROM, immediately before a PLL frequency synthesizer is started, converting a composite signal of the output signal read from the storage unit and the digital value read from the ROM into a temperature compensation signal as an output voltage corresponding to the composite signal by a D-A converter, and applying the output voltage to a capacitor of a loop filter, turning on a loop switch to cut off the loop filter from a charge pump, and commanding the PLL frequency synthesizer to perform a high-speed frequency lock operation, detecting an output signal from the A-D converter in a frequency stable state, and receiving new temperature information from the temperature detector and storing the output signal and the information in the storage unit, immediately before an operation of the PLL frequency synthesizer is stopped, and turning off the loop switch, and stopping the PLL frequency synthesizer.

A PLL frequency synthesizer of the present invention has a function of storing, in a storage unit, the control voltage value of a frequency control voltage which is oscillated and output by a voltage-controlled oscillator in the frequency stable state when the apparatus is operative, and reading the stored contents from the storage unit to apply the output voltage in the previous operative state to the control terminal of the voltage-controlled oscillator without an error when the apparatus is operated again. In another PLL frequency synthesizer of the present invention, temperature information in the frequency stable state is stored in a storage unit, and the information is read from the storage unit when the apparatus is operated again to apply an output voltage taking a change in temperature into consideration. In both PLL frequency synthesizers, a stable high-speed frequency lock operation is always performed by the frequency synthesizer.

As is apparent from the above description, according to a PLL frequency synthesizer of the present invention, temperature information or a frequency control voltage oscillated and output from a voltage-controlled oscillator in the stable of a frequency is stored. When the apparatus is restarted, a high-speed frequency lock operation can be stably performed regardless of a change in temperature or irregularities in devices (particularly variations due to the voltage-controlled oscillator) because the output voltage or a temperature-compensated output voltage is applied to a loop filter without an error.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIG. 5 is a flow chart showing the operation of the second embodiment shown in FIG. 4.

DETAILED DESCRIPTION OF THE PREFERRED EMBODIMENTS

Preferred embodiments of a PLL frequency synthesizer of the present invention will be described below in detail with reference to the accompanying drawings (FIGS. 2 to 5). Note that the PLL frequency synthesizer of the present invention intermittently operates at the same frequency.

Figure 1:
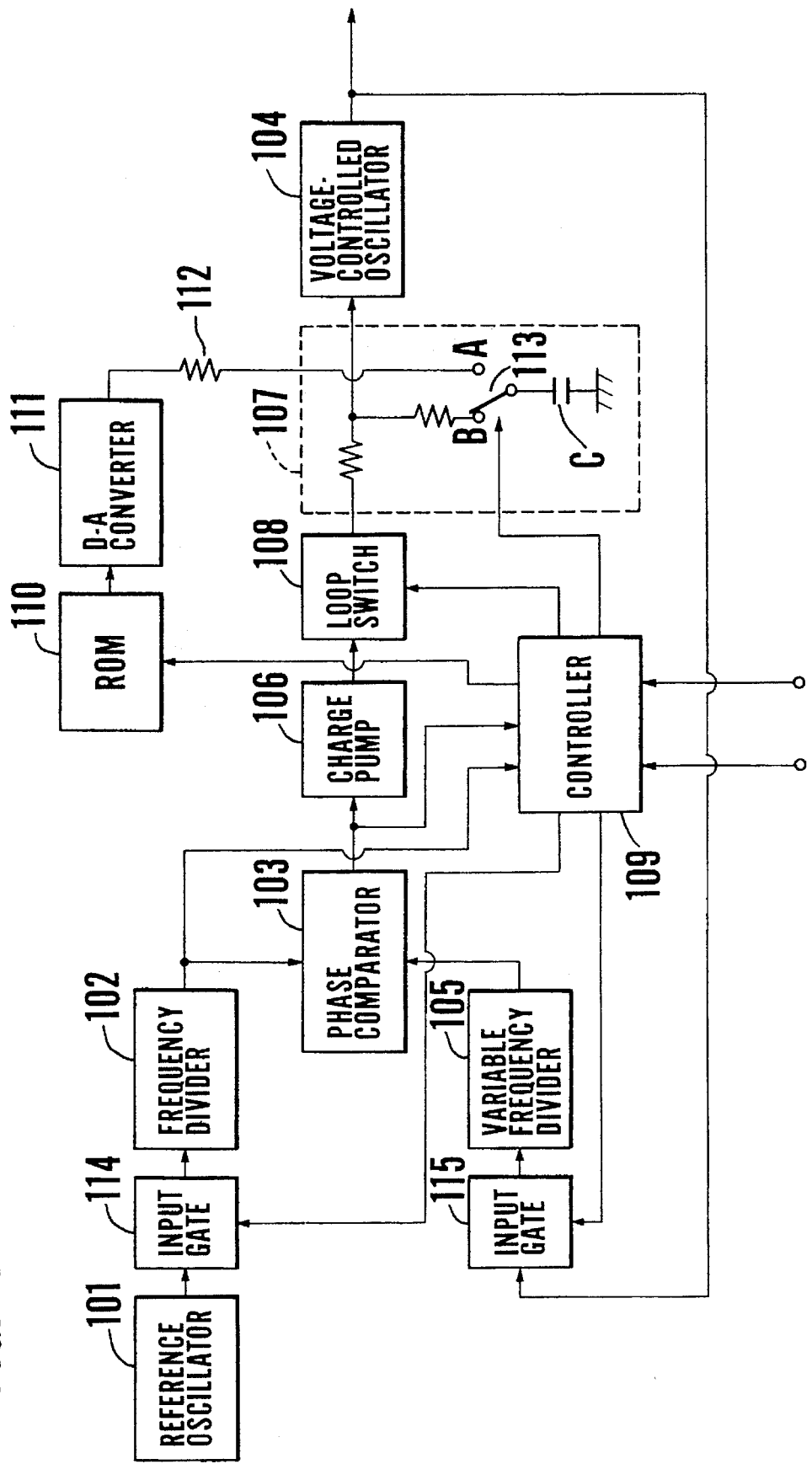
FIG. 1 is a block diagram showing a conventional PLL frequency synthesizer.
Figure 2:
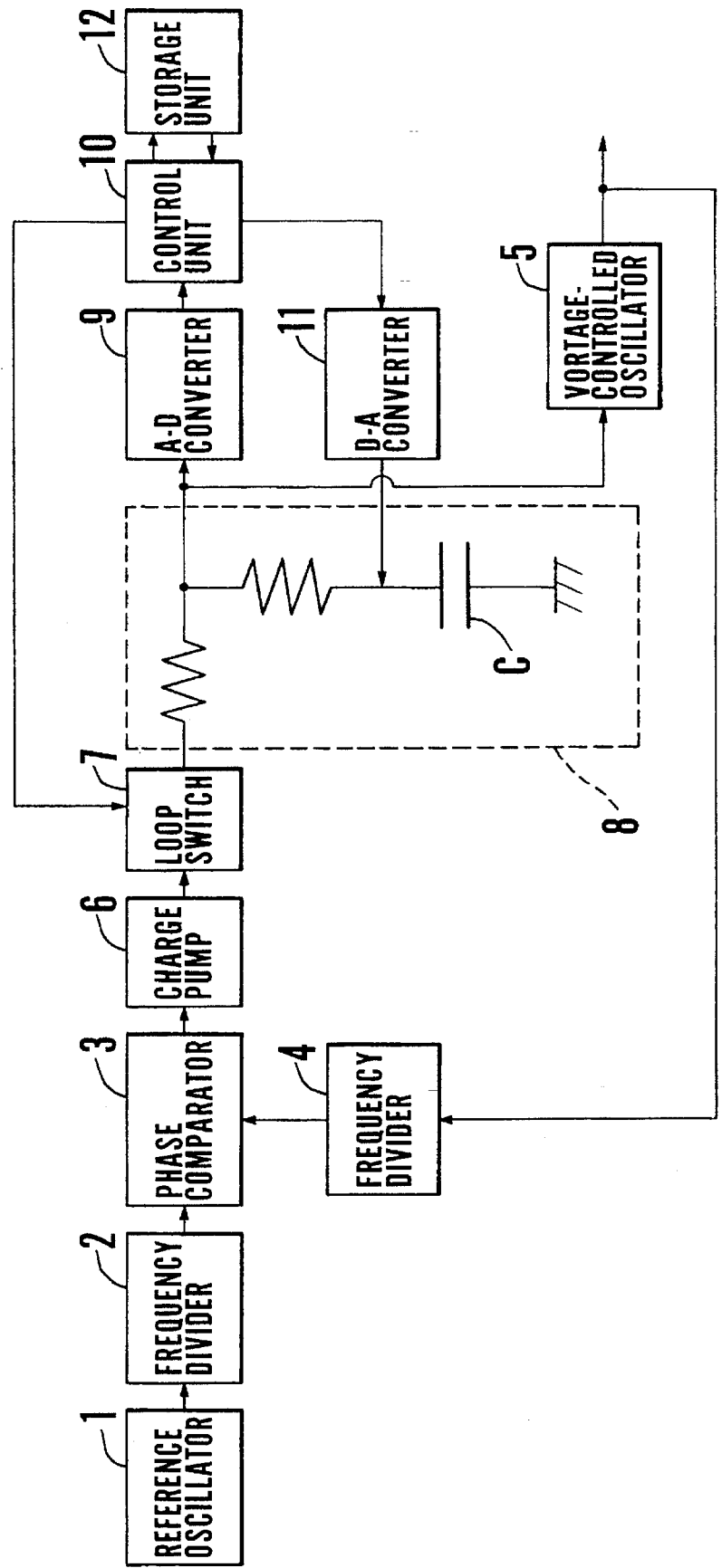
FIG. 2 is a block diagram showing the first embodiment of the present invention.

FIG. 2 is a block diagram showing the basic arrangement of a PLL frequency synthesizer according to an embodiment of the present invention.

This PLL frequency synthesizer includes a reference oscillator 1 for oscillating and outputting an analog reference oscillation voltage, and a voltage-controlled oscillator (VCO) 5 for oscillating and outputting an analog frequency control voltage to compensate the phase difference component with respect to the reference voltage in order to obtain a stable output frequency synchronized with the reference voltage.

The PLL frequency synthesizer also includes, as its main components, an A-D (analog-digital) converter 9 for receiving the frequency control voltage in the frequency stable state, and converting the voltage into a corresponding digital signal and outputting the digital signal, a storage unit 12 for storing the signal output voltage value of the digital signal, a D-A (digital-analog) converter 11 for converting the signal output voltage value into a corresponding analog signal and for outputting the analog signal, a control unit 10 for controlling the input of the frequency control voltage to the A-D converter 9, reading of the signal output voltage from the storage unit 12, and the output of the analog signal from the D-A converter 11, and a loop filter 8 for applying the output voltage of the analog signal to the voltage-controlled oscillator 5 by the control unit 10 before the apparatus is started.

A general operation of the PLL frequency synthesizer will be briefly described below. When the PLL frequency synthesizer is in an initial operative state, the reference oscillation voltage oscillated and output from the reference oscillator 1 is frequency-divided by a frequency divider 2 and then input to a phase comparator 3. On the other hand, the frequency control voltage oscillated and output from the voltage-controlled oscillator 5 is frequency-divided by a frequency divider 4 and then input to the phase comparator 3. The phase comparator 3 outputs a phase difference signal corresponding to the phase difference between the voltages from the frequency dividers 2 and 4. The phase difference signal (pulse signal) output from the phase comparator 3 is input to the terminal of the voltage-controlled oscillator 5 through a charge pump 6 for converting the pulse signal into a voltage value, a loop switch 7 in a shorted state, and the loop filter 8. The voltage-controlled oscillator 5 oscillates and outputs a frequency control voltage obtained upon compensating the phase difference. With this operation, a stable output frequency synchronized with the reference signal can be obtained.

On the other hand, when the PLL frequency synthesizer is in an OFF state, the control unit 10 controls to turn off the loop switch 7. All of the reference oscillator 1, the frequency divider 2, the phase comparator 3, the frequency divider 4, the voltage-controlled oscillator 5, and the charge pump 6 are turned off. In so-called intermittent control in which the power is turned off in an unused state for power savings, viewpoint of system matching, the frequency control voltage output from the voltage-controlled oscillator 5 to output a predetermined frequency must be held by a capacitor C of the loop filter 8, and the high-speed frequency lock operation needs to be performed upon restarting the PLL frequency synthesizer. Since the charge held on the capacitor C may vary depending on the form of the charge pump 6, the loop switch 7 is provided to ensure the OFF state of the circuit.

Figure 3:
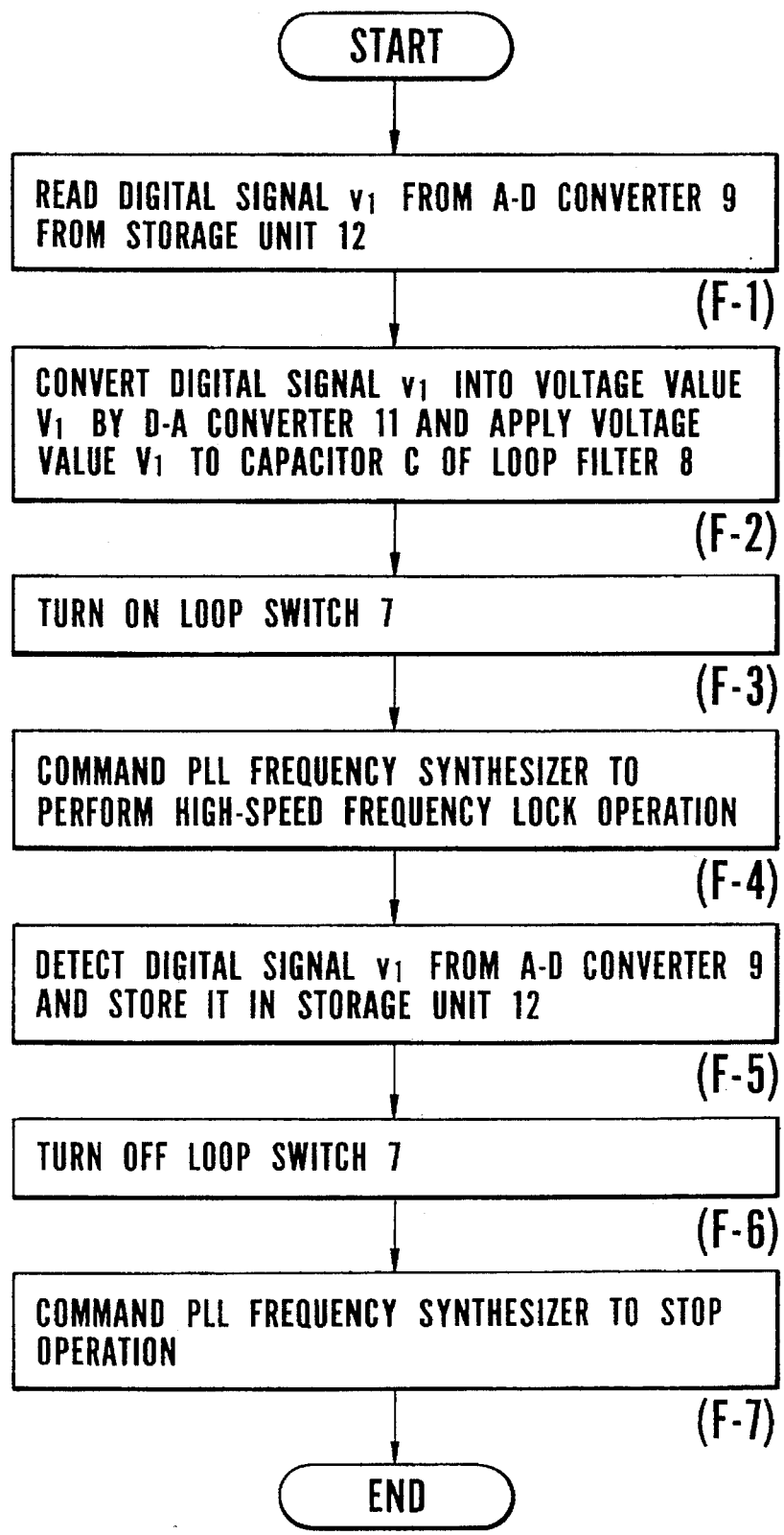
FIG. 3 is a flow chart showing the operation of the first embodiment shown in FIG. 2.

The operation of the first embodiment of the present invention shown in FIG. 2 will be described with reference to the flow chart shown in FIG. 3.

Immediately before the PLL frequency synthesizer is started, the control unit 10 reads a signal $v_1$ stored in the storage unit 12 (F-1). The D-A converter 11 converts the signal $v_1$ into an analog signal corresponding to the signal value and output this analog signal. The output voltage $V_1$ of the analog signal is applied to the capacitor C of the loop filter 8 (F-2). When the loop switch 7 is turned on (F-3) to start the PLL frequency synthesizer, the output voltage $V_1$ has already been applied to the loop filter 8 to obtain a predetermined frequency. Therefore, a high-speed frequency lock operation is performed (F-4).

Subsequently, immediately before the operation of the PLL frequency synthesizer is stopped, the digital signal obtained upon converting the analog signal output through the loop filter 8 by the A-D converter 9 in the frequency stable state is detected and stored in the storage unit 12 (F-5). The loop switch 7 is then turned off to stop the PLL frequency synthesizer (F-7).

Figure 4:
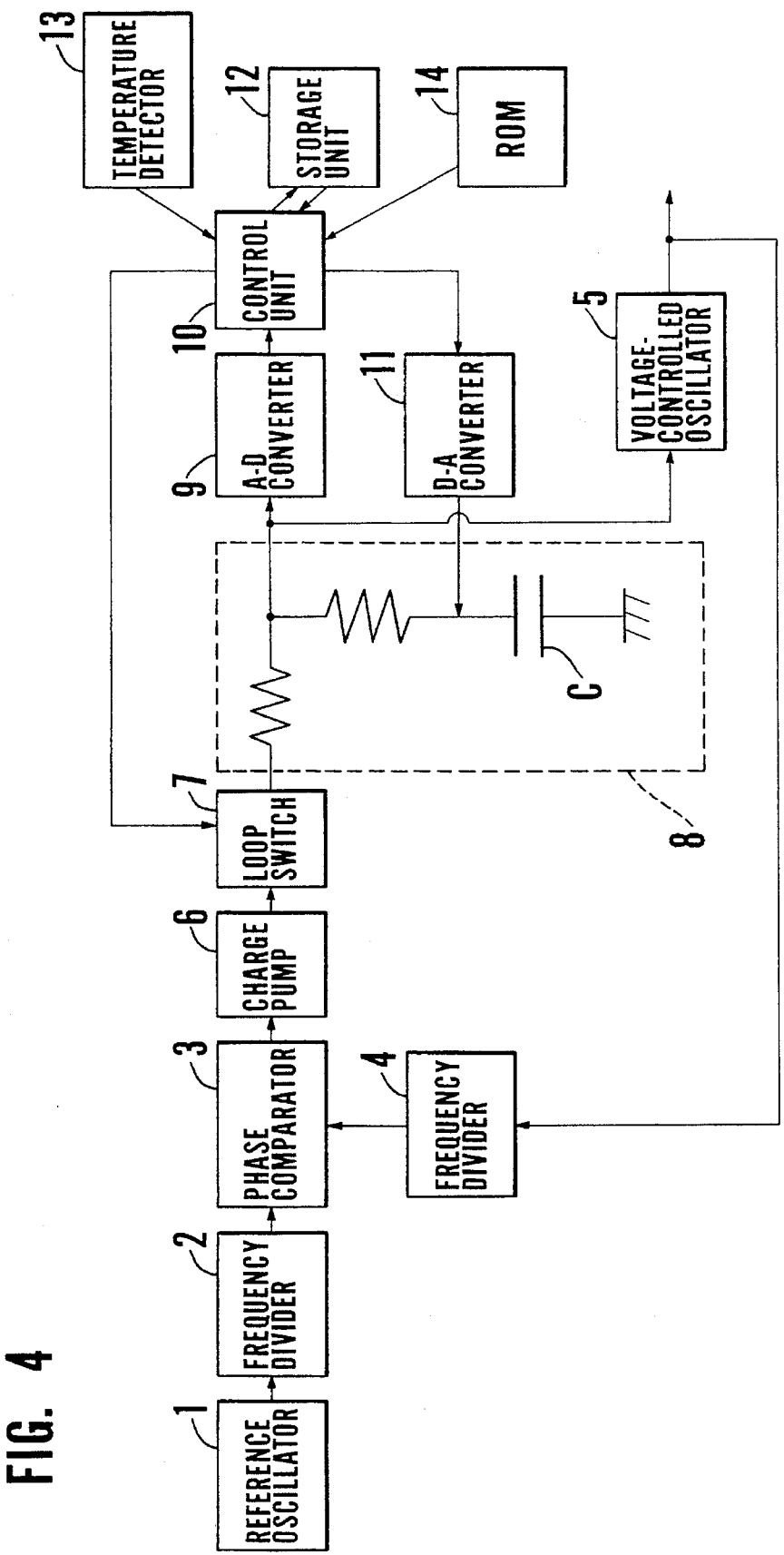
FIG. 4 is a block diagram showing the second embodiment of the present invention.

FIG. 4 is a block diagram showing the basic arrangement of a PLL frequency synthesizer according to another embodiment (second embodiment). In this PLL frequency synthesizer, an output voltage is applied to a loop filter 8 on the basis of a change in temperature detected in an OFF state.

More specifically, the PLL frequency synthesizer of this second embodiment comprises a temperature detecting means for detecting temperatures $T_1$ and $T_2$ of the apparatus, and a temperature compensating means for outputting a compensation signal $\Delta v$ for compensating the potential difference between terminals of a control unit 10 in correspondence with the temperature difference $(T_2-T_1)$ between the operative and inoperative states of the apparatus. The control unit 10 converts a digital signal $v_1$ (first digital signal) from an A-D converter 9 into a temperature-compensated temperature compensation digital signal $v_1+\Delta v$ (second digital signal) on the basis of the digital signal $v_1$ and the compensation signal $\Delta v$.

The operation of the second embodiment will be described with reference to the flow chart shown in FIG. 5.

The control unit 10 receives the temperature information $T_2$ detected by a temperature detector 13 immediately before the PLL frequency synthesizer is started. The control unit 10 reads the temperature information $T_1$ and the digital signal $v_1$ stored in a storage unit 12 to confirm the temperature difference $(T_2-T_1)$. The control unit 10 reads information of the digital value $\Delta v$ of the voltage change amount corresponding to the temperature difference $(T_2-T_1)$ from a ROM (Read Only Memory) 14 (S-1), and sends the composite digital signal $v_1+\Delta v$ generated upon adding the digital signal $\Delta v$ to the digital signal $v_1$ to a D-A converter 11. The D-A converter 11 converts the composite digital signal into a temperature-compensated compensation analog signal $V_1+\Delta V$ and outputs this signal. At this time, the output voltage $V_1+\Delta V$ of the compensation analog signal is applied to the loop filter 8 (S-2). That is, the temperature detector 13 and the ROM 14 act as the above-mentioned temperature detecting means and temperature compensating means, respectively.

Subsequently, the control unit 10 detects the digital signal $v_1$ obtained upon converting the analog signal output through the loop filter 8 by the A-D converter 9 in the frequency stable state immediately before the PLL frequency synthesizer is turned off, and stores the digital signal $v_1$ in the storage unit 12. At the same time, the control unit 10 receives the temperature information $T_1$ from the temperature detector 13 and stores this information in the storage unit 12.

In the PLL frequency synthesizer of the second embodiment, even when the temperature abruptly changes between intermittent operations, the output voltage can be applied to a voltage-controlled oscillator 5 to obtain a predetermined frequency while minimizing errors. Therefore, a stable high-speed frequency lock operation can be performed.

The improved PLL frequency synthesizer can also be used while changing the frequency. In this case, when the power is turned on, the divisor of a frequency divider 4 is changed, and the frequency is changed, e.g., from L to H channels. The control voltage and the temperature information at that time are stored in the storage unit 12 in correspondence with the frequency values.

Immediately before the PLL frequency synthesizer is started and thereafter, as in the second embodiment, the temperature detection, confirmation of the temperature difference, output of the composite digital signal $v_1+\Delta v$ obtained upon adding the digital signal $\Delta v$ due to the change in temperature to the digital signal $v_1$ and the like are performed, and the output voltage $V_1+\Delta V$ of the compensation analog signal is then applied to the loop filter 8.

Also in this case, the output voltage can be applied to the voltage-controlled oscillator 5 to obtain a predetermined frequency while minimizing errors. Therefore, a stable high-speed frequency lock operation can be performed.

Modifications of the invention herein disclosed will occur to a person skilled in the art and all such modifications are deemed to be within the scope of this invention as defined by the appended claims.

What I claim is:

1. A PLL frequency synthesizer including a loop filter, comprising an A-D converter for receiving a frequency control voltage from a voltage-controlled oscillator in a stable frequency state to output a first digital signal corresponding to the frequency control voltage, a storage unit for storing the first digital signal from said A-D converter, temperature compensating means for outputting a potential difference between frequency control terminals in correspondence with a temperature difference, a control unit for adding the potential difference to the first digital signal in the frequency stable state to output a second digital signal, a D-A converter for converting the second digital signal into an analog signal and outputting the analog signal, and means for applying an output voltage of the analog signal to said loop filter before said frequency synthesizer is started.

2. A PLL frequency synthesizer which includes a voltage controlled oscillator for oscillating and outputting an analog frequency control voltage such that a phase difference component with respect to a reference oscillation voltage is compensated to obtain a stable output frequency synchronized with an analog reference oscillation voltage oscillated and output from a reference oscillator, comprising an A-D converter for receiving the frequency control voltage in a stable frequency state, and for converting the frequency control voltage into a corresponding digital signal and outputting the digital signal, a storage unit for storing a signal value of the digital signal, a D-A converter for converting the signal value into a corresponding analog signal and for outputting the analog signal, a control unit for controlling input of the frequency control voltage to said A-D converter, reading of the signal value from said storage unit, and output of the analog signal from said D-A converter, a loop filter for applying an output voltage of the analog signal to said voltage-controlled oscillator by said control unit before said synthesizer is started, a temperature detecting means for detecting a temperature around said synthesizer, and temperature compensating means for outputting a temperature compensation signal for compensating a potential difference between terminals of said control unit in correspondence with a temperature difference between operative and inoperative states of said synthesizer, and wherein said control unit converts the analog signal into a temperature-compensated temperature compensation analog signal on the basis of the signal value and the compensation signal.

3. A high-speed frequency lock method comprising the steps of:

reading, from a storage unit, an output signal from an A-D converter, and first temperature information immediately before a previous stop, and receiving second temperature information detected by a temperature detector to read a digital value of a voltage change amount corresponding to a temperature difference with respect to the first temperature information from a ROM, immediately before a PLL frequency synthesizer is started;

converting a composite signal of the output signal read from said storage unit and the digital value read from said ROM into a temperature compensation signal as an output voltage corresponding to the composite signal by a D-A converter, and applying the output voltage to a capacitor of a loop filter;

turning on a loop switch to cut off said loop filter from a charge pump, and commanding said PLL frequency synthesizer to perform a high-speed frequency lock operation;

detecting an output signal from said A-D converter in a frequency stable state, and receiving new temperature information from said temperature detector and storing the output signal and the information in said storage unit, immediately before an operation of said PLL frequency synthesizer is stopped; and turning off said loop switch, and stopping said PLL frequency synthesizer.

* * * * *